(12) United States Patent
Wakabayashi et al.

(10) Patent No.: US 7,098,156 B2
(45) Date of Patent: Aug. 29, 2006

(54) METHOD OF FABRICATION OF SEMICONDUCTOR INTEGRATED CIRCUIT DEVICE

(75) Inventors: Takayuki Wakabayashi, Mito (JP); Toshiyuki Uchino, Kokubunji (JP); Yasuo Kiguchi, Iruma (JP); Atsuyoshi Koike, Kunitachi (JP)

(73) Assignee: Renesas Technology Corp., Tokyo (JP)

( * ) Notice: Subject to any disclaimer, the term of this patent is extended or adjusted under 35 U.S.C. 154(b) by 124 days.

(21) Appl. No.: 10/475,142

(22) PCT Filed: Apr. 4, 2002

(86) PCT No.: PCT/JP02/03391

§ 371 (c)(1),
(2), (4) Date: Apr. 15, 2004

(87) PCT Pub. No.: WO02/086963

PCT Pub. Date: Oct. 31, 2002

(65) Prior Publication Data

US 2004/0166689 A1 Aug. 26, 2004

(30) Foreign Application Priority Data

Apr. 19, 2001 (JP) .............................. 2001-121735

(51) Int. Cl.
*H01L 21/00* (2006.01)
(52) U.S. Cl. ...................................... 438/800; 414/935

(58) Field of Classification Search ................ 438/800; 414/935, 936, 937, 938, 939, 940, 941
See application file for complete search history.

(56) References Cited

U.S. PATENT DOCUMENTS

2002/0025244 A1* 2/2002 Kim .......................... 414/217

FOREIGN PATENT DOCUMENTS

| JP | 63-37628 | 2/1988 |
| JP | 5-3240 | 1/1993 |
| JP | 6-236914 | 8/1994 |
| JP | 9-36198 | 2/1997 |
| JP | 11-330197 | 11/1999 |
| JP | 2001-102427 | 4/2001 |

OTHER PUBLICATIONS

International Search Report for PCT/JP02/03391.

* cited by examiner

*Primary Examiner*—Scott B. Geyer
(74) *Attorney, Agent, or Firm*—Antonelli, Terry, Stout and Kraus, LLP.

(57) ABSTRACT

The conveyance of wafers in bays (equipment groups) of a clean room is performed by RGVs (Rail Guided Vehicles) that linearly travel at high speed on conveying rails laid on the floor of the clean room. A structure is adopted wherein a conveying area, over which the RGV travels, is separated from a human working area by a compartment (partition), and a human is not allowed to enter the conveying area upon operation of a line.

8 Claims, 6 Drawing Sheets

METHOD OF FABRICATION OF SEMICONDUCTOR INTEGRATED CIRCUIT DEVICE

TECHNICAL FIELD

The present invention relates to a technology for manufacturing a semiconductor integrated circuit device, and, more particularly, the invention relates to a technology applicable to a wafer conveying system of the type employed in a semiconductor production line.

BACKGROUND ART OF THE INVENTION

With multiproduct formation of semiconductor products and short-living of a cycle time, a semiconductor production line is required to further shorten the TAT (Turn Around Time) and shorten the process processing time. With the trend toward an increase in the diameter of a semiconductor wafer (hereinafter simply called wafer), the weight per wafer is on the increase. Therefore, automatic processing of wafer conveyance by a machine becomes an essential requisite for a semiconductor production line that handles a wafer having a diameter of 300 mm.

In a semiconductor production line that accommodate a 300-mm wafer, the various manufacturing apparatus employed in the production are generally divided into equipment groups called bays, which in turn are disposed within a clean room in bay units. Therefore, a wafer automatic conveying system is also configured so as to be divided into elements (components), such as those related to bay-to-bay conveyance, those related to bay-in conveyance and stockers, correspondingly.

Of these components, a ceiling conveying method called an OHS (Over Head Shuttle) is generally used in the bay-to-bay conveyance. A conveying vehicle called a RGV (Rail Guided Vehicle) that automatically travels on a track, a conveying vehicle called an AGV (Automatic Guided Vehicle) that automatically travels on a non-track path, or an OHT (Over-Head Hoist transport) corresponding to one ceiling conveying method, or the like is used in the bay-in conveyance.

The stockers are disposed in relay locations between the bay-to-bay conveyance elements and the bay-in conveyance elements, respectively. Each wafer accommodated in the wafer conveying means (wafer carrier) is temporarily held in its corresponding stocker, after which it is conveyed into the bay. As the 300-mm wafer conveying means (wafer carrier), there is one which is called a FOUP (FOUP: Front Opening Unified Pod) wherein a wafer cassette and a pod (box) are unified to make it possible to convey a plurality of sheets of wafers in a sealed state, or there is another one which is called an open cassette (Open Cassette: OC) wherein a wafer is exposed in the clean room.

Incidentally, the wafer conveying system for a semiconductor production line that accommodates a 300-mm wafer has been described in "Monthly Semiconductor World", Press Journal Inc., issued on Dec. 20, 1997, pp. 131–149.

SUMMARY OF THE INVENTION

According to the investigations of the present inventors, the wafer conveying system for a 300 mm-wafer adaptable semiconductor production line which has heretofore been proposed, has encountered difficulties in realizing a shortening of the wafer conveying time and an improvement in the line availability factor, and it particularly has created a bottleneck in the TAT shortening of each product which is short in a delivery period due to the following problems.

(1) A ground travel type wafer conveying system which has been introduced in a semiconductor production line up to a 200 mm wafer generation needs to restrict the maximum traveling speed and take safety measures provided by the industry with respect to the presence of conveying vehicles (AGV and RGV) in a conveying area in order to allow the conveying vehicles and humans to coexist with one another. However, since such safety measures interfere with an increase in the traveling speed of each conveying vehicle in the conveying system, based on the presumption that the conveying vehicles and humans must coexist with one another, a shortening of the wafer conveyance time is restricted.

(2) A ground travel type wafer conveying system using AGVs and RGVs needs to perform a cooperative service involving a plurality of conveying vehicles and to provide a system (algorithm) for realizing complex conveying routes in order to enhance the capability of conveyance of each wafer. However, since time frequently is required to wait for each conveying vehicle in such a complex system, it is difficult to realize an improvement in the line availability factor.

An object of the present invention is to provide a wafer conveying system that is capable of shortening the wafer conveying time.

Another object of the present invention is to provide a wafer conveying system that is capable of improving the availability factor of a semiconductor production line.

A further object of the present invention is to provide a wafer conveying system that is capable of shortening the wafer processing time.

The above, other objects and novel features of the present invention will become more apparent from the description provided in this present Specification and from the accompanying drawings.

A summary of representative aspects of the invention disclosed in the present application will be described in brief as follows:

The present invention is directed to formation of integrated circuits on wafers by using a semiconductor production line in which a plurality of single wafer processing type semiconductor manufacturing apparatuses are partitioned into a plurality of bays (equipment groups) which are installed within a clean room, along with a wafer conveying system including bay stations, which performs bay-to-bay conveyance and bay-in conveyance and wafer relay. The wafer bay-in conveyance is performed by RGVs, each of which moves forward and backward alternately along a single linear conveying rail provided within a conveying area separated from a human working area.

The conveying rails on which RGVs linearly travel are respectively shared between a plurality of RGVs according to the required amount of conveyance of each wafer and the mode of its conveyance, and the travelling areas of the plurality of RGVs are respectively mutually separated from the travelling areas of other RGVs.

The bay-in conveyance of each wafer and the bay-to-bay conveyance thereof are performed in a state in which each wafer is sealed in a FOUP. By reducing the number of wafers accommodated in a FOUP, the processing time per wafer is shortened.

BEST MODE FOR CARRYING OUT THE INVENTION

Figure 1:
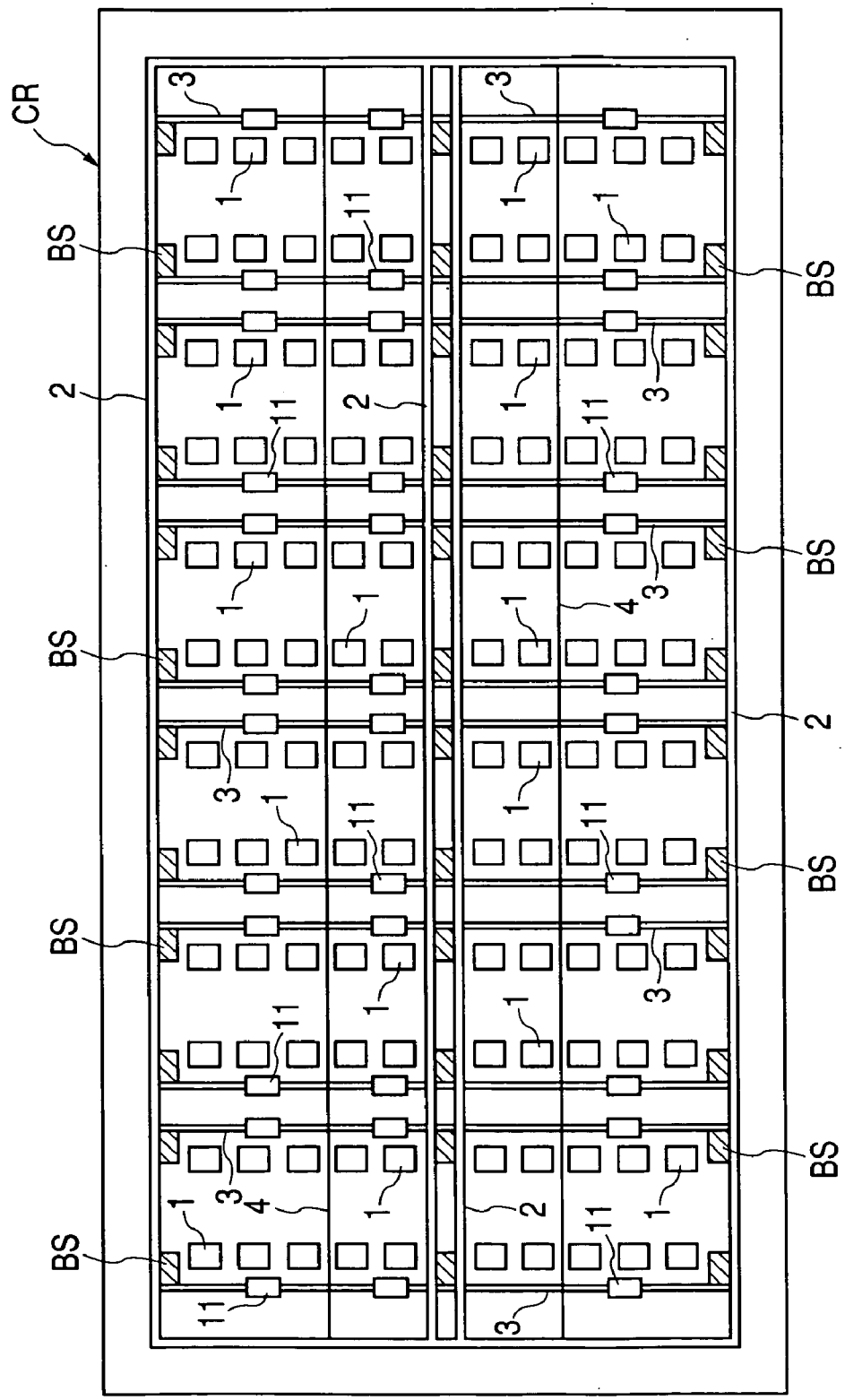
FIG. 1 is an overall plan view showing a wafer full-automatic conveying system for a semiconductor production line illustrative of one embodiment of the present invention.

Embodiments of the present invention will hereinafter be described in detail based on the accompanying drawings. Incidentally, members having the same functions in all of the drawings are respectively identified by the same reference numerals, and their repetitive description will be omitted.

Figure 2:
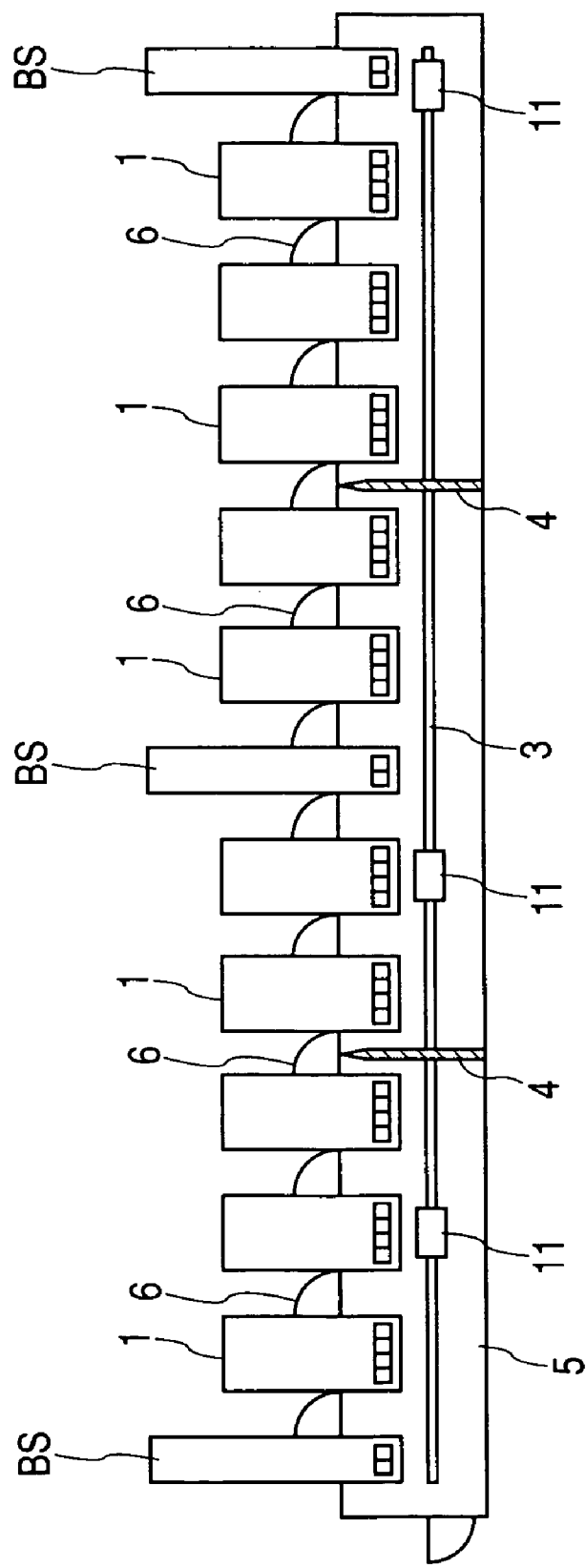
FIG. 2 is a plan view illustrating part of the conveying system shown in FIG. 1.

FIG. 1 is an overall plan view showing a wafer full-automatic conveying system for a semiconductor manufacturing or production line, which is associated with a wafer having a diameter of 300 mm, and FIG. 2 is a plan view showing part (area corresponding to 3 bays) of the conveying system.

Various manufacturing apparatuses 1, such as thermal treatment equipment, an ion implantation system, an etching system, a deposition apparatus, cleaning equipment, a photoresist coating apparatus, an exposure system, etc., of the type employed in semiconductor manufacture are divided into plural bays (equipment groups) and placed within a clean room CR. The wafer conveying system disposed within the clean room CR corresponds to such placement and is constituted by bay stations (stockers) BS which perform bay-to-bay conveyance and bay-in conveyance and wafer relay.

The bay-to-bay conveyance is performed by an OHS (Over Head Shuttle) for conveying each wafer via a track 2 mounted to the ceiling in the clean room CR. On the other hand, the bay-in conveyance is performed by RGVs (Rail Guided Vehicles) (wafer conveying means) 11 that travel on conveying rails 3 load on the floor of the clean room CR. The conveying rails 3 are shared among a plurality of the RGVs 11 according to the required amount of conveyance of each wafer and the form or mode of its conveyance. Each of the RGVs 11 is capable of running or travelling at a high speed equivalent to twice or more of the speed (60 m/s) of an AGV (Automatic Guided Vehicle) that travels on a non-track path.

The wafer conveying system according to the present embodiment is characterized in that the conveying rails 3 are respectively laid on straight paths along the bays to thereby set the travelling of the RGVs 11, which move between the apparatuses, as simple linear reciprocating motions. Limiting the travelling of the RGVs 11 to linear reciprocating motions makes it possible to realize a space saving for each conveying area and to eliminate the need for construction of an algorithm for establishing complex feeding or conveying paths or routes. Further, even when the layout of the manufacturing apparatuses 1 is changed later, the present embodiment is capable of flexibly coping with such changes.

Also, in the wafer conveying system according to the present embodiment, the travelling areas of the respective RGVs 11 are respectively separated by compartments (partitions) 4, and one bay station BS is assigned to one RGV 11. Thus, since there is no mutual interference with other RGVs 11 that respectively share the use of the conveying rails 3, waiting times for other RGVs 11 do not occur, thus making it possible to enhance the production efficiency of the whole production line. By assigning one bay station BS to one RGV 11, the wafer conveyed to a bay station BS via the OHS can be quickly delivered to the associated RGV 11. Namely, since the wafer can be delivered without the need for a stocker that is intended for temporary storage of the wafer, the time required to feed the wafer can be shortened. A size reduction in the bay station BS is also enabled and space saving in the clean room can be realized as a result.

Figure 3:
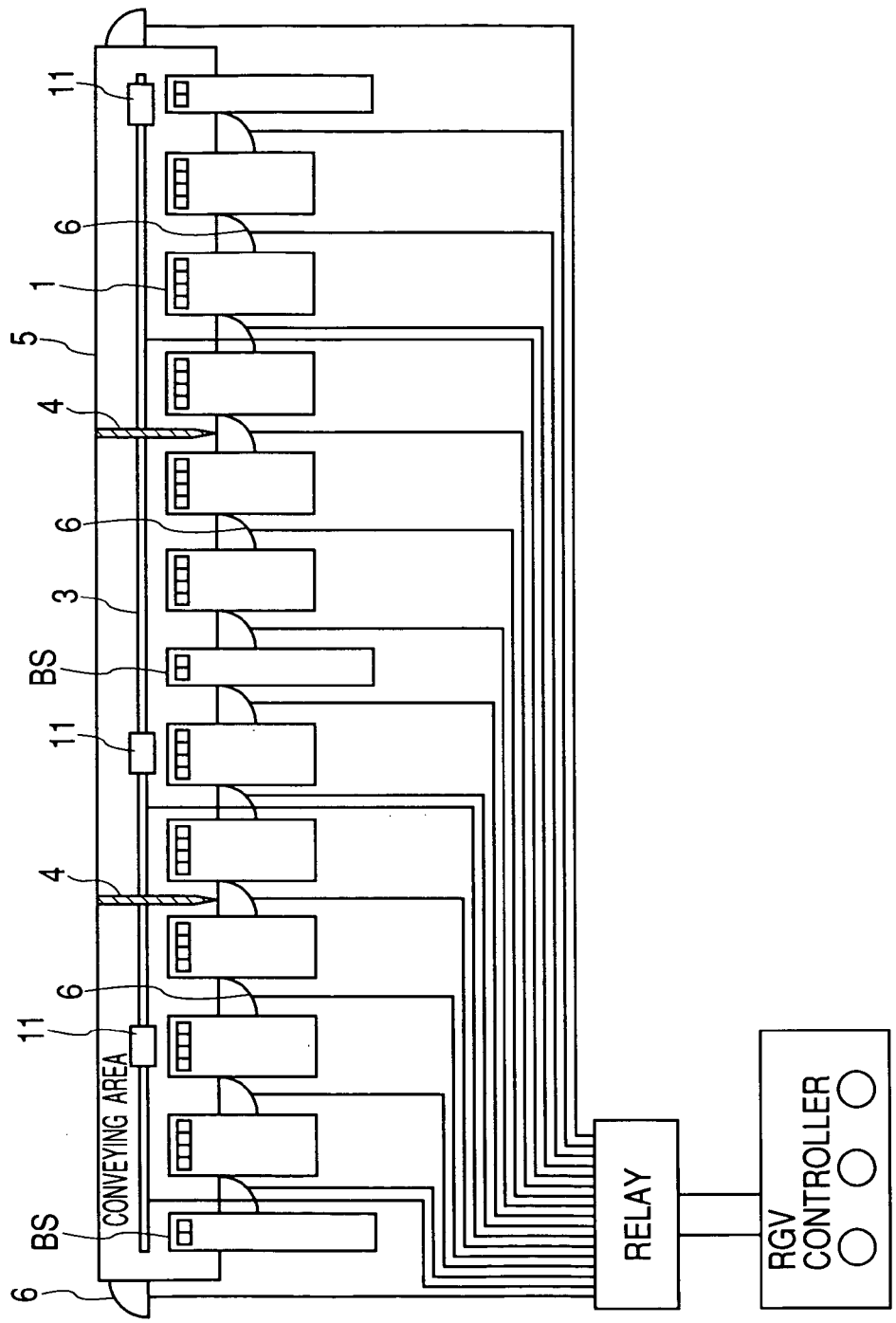
FIG. 3 is a side sectional view illustrating an interlock control method of the conveying system shown in FIG. 1.

Further, the wafer conveying system according to the present embodiment has a structure wherein the conveying areas, in which the conveying rails 3 are laid, are adjoined by compartments (partitions) 5, and gates 6 are respectively provided between the adjacent manufacturing apparatuses 1, thereby separating the conveying areas and human working areas and preventing humans from entering into the conveying areas upon operation of the line. The gates 6 provided among the apparatuses are respectively connected to an interlock control system for the RGVs 11, such as shown in FIG. 3. When the gate 6 is opened, the corresponding RGV 11 stops at once so that the safety of a human that has entered the conveying area carelessly can be ensured. When the human enters the corresponding conveying area with a view toward performing maintenance or the like on the manufacturing apparatuses 1 and the RGVs 11, upon non-operation of the line, the human enters the conveying area after having unlocked the gate 6.

Thus, since the wafer conveying system according to the present embodiment is designed on the presumption that the conveying areas do not coexist with the areas allocated for humans, safety measures (such as the installation of running indicator lights, safety sensors) for the RGVs 11, which are specified by the industry, can be relaxed. It is also possible to increase the travelling maximum speed of each RGV 11 and thereby shorten the conveying or carrier time. Since the travelling of the RGV 11 is limited to a linear reciprocating motion, the need for the RGVs 11 to be decelerated at curves and branches or the like is eliminated. Therefore, the travelling of each RVG 11, while maintaining the maximum speed up to the intended place or location, is enabled. In this way, the conveying time of each wafer can be further shortened.

Since feeding of the wafer at high speed is enabled, the influence of the waiting time for each RGV 11 on the productivity of the whole production line is reduced. Therefore, it is also feasible to cause the RGVs 11 to standby for the purpose of conveyance of a specific lot, for example. The TAT of each product, in which the period from the receipt of an order to the delivery is short, can be significantly shortened.

Figure 4:
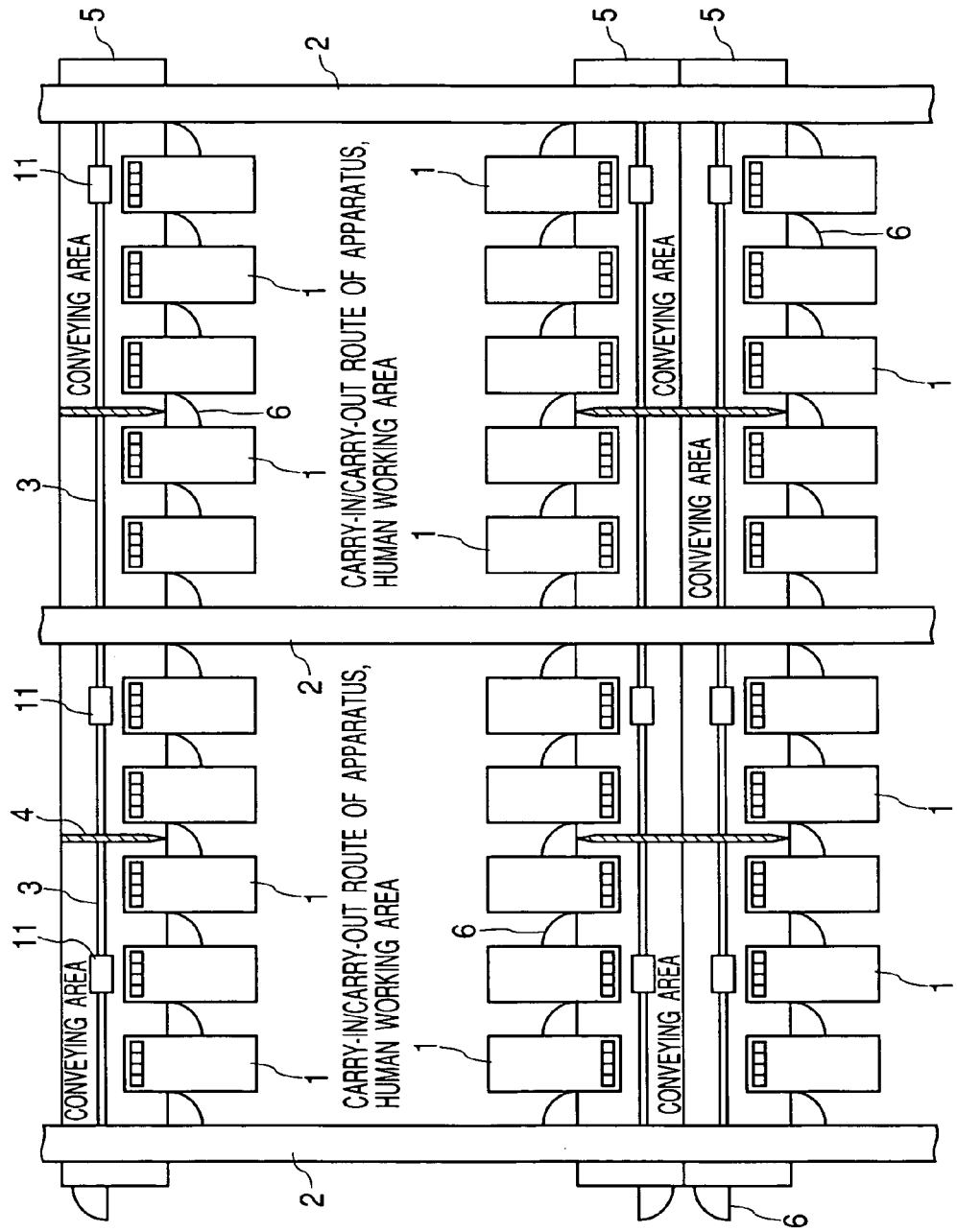
FIG. 4 is a plan view depicting wafer conveying areas and working areas for the semiconductor production line shown in FIG. 1.

Since the wafer conveying areas and the human working areas are completely separated from one another in the wafer conveying system according to the present embodiment, routes taken, where new manufacturing apparatuses 1 are carried in the clean room and retired manufacturing apparatuses 1 are carried out of the clean room, are respectively provided on the sides opposite to the conveying areas, with the manufacturing apparatuses 1 interposed therebetween, as shown in FIG. 4. Since the wafer conveying system according to the present embodiment is capable of achieving space-savings in the conveying areas, the carry-in/carry-out routes of the apparatuses can be widely ensured correspondingly. Also, human operations, such as a terminal operation of each apparatus, its monitoring, and the maintenance (chamber cleaning, part replacement, repairing, parameter's adjustments) of each apparatus, can also be performed here.

The semiconductor production line according to the present embodiment is designed on the presupposition that all steps in a wafer process are processed by a single wafer processing system.

Upon wafer conveyance between the bays and within the bays, a wafer cassette and a pod (box) are integrated into one, and a FOUP (FOUP: Front Opening Unified Pod) that is capable of accommodating about 25 sheets of wafers at the maximum in a sealed state is used. Since the FOUP is a wafer carrier for conveying each wafer in the sealed state, the cleanliness factor of each wafer can be held to Class 1 or less without depending on the surrounding environment. Thus, since the whole clean room CR need not be cleaned up to Class 1 or less, the facility costs of the clean room CR can be reduced and the degree of freedom of design can be enhanced. Since the FOUP is capable of reliably fixing each wafer, as compared with an open cassette for accommodating each wafer in a state of being open to the clean room CR, the FOUP has a high impact resistance and is suitable for high-speed conveyance.

Figure 5:
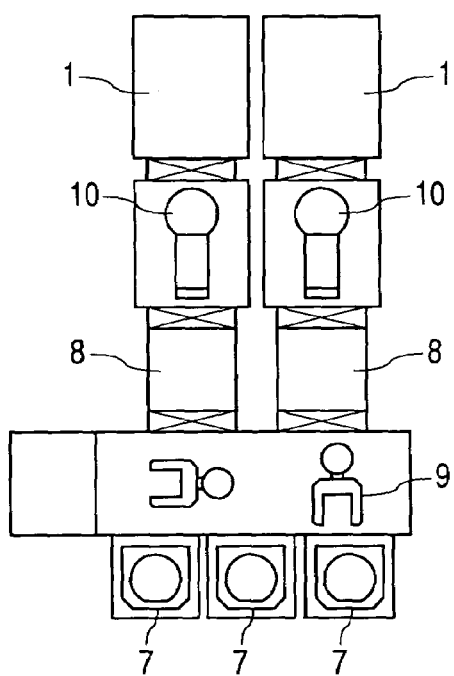
FIG. 5 is a diagram illustrating a wafer transfer method suitable for use in each manufacturing apparatus installed in the semiconductor production line shown in FIG. 1.
Figure 6:
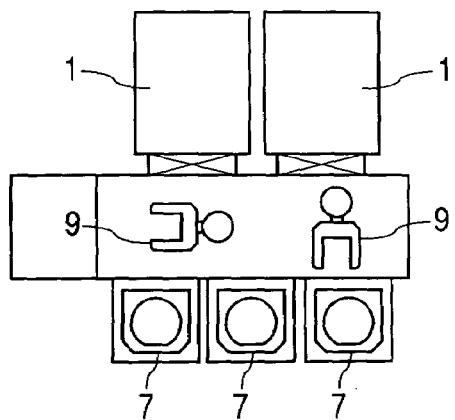
FIG. 6 is a diagram illustrating a wafer transfer method suitable for use in each manufacturing apparatus installed in the semiconductor production line shown in FIG. 1.
Figure 7:
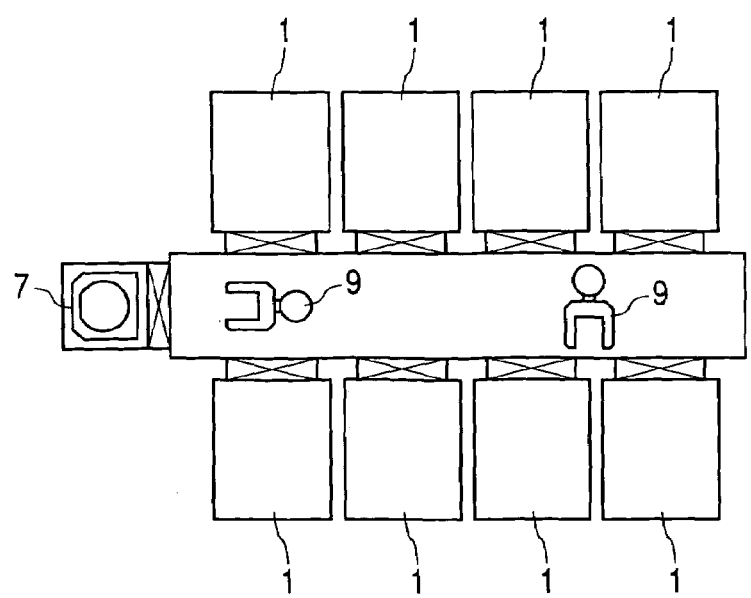
FIG. 7 is a diagram illustrating a wafer transfer method suitable for use in each manufacturing apparatus installed in the semiconductor production line shown in FIG. 1.

The FOUP which accommodates the wafers therein is fed to its corresponding bay station BS in a predetermined bay by the OHS mounted to the ceiling in the clean room CR, from which it is transferred to the corresponding RGV 11 and conveyed to the manufacturing apparatus 1 in the bay. The FOUP is provided with a door at the front facing the manufacturing apparatus 1, and it conveys one wafer into the apparatus while the door is being brought into close contact with a loader of the manufacturing apparatus 1. Each manufacturing apparatus 1 is provided with a door opener for opening/closing the door of the FOUP. Thus, as the configuration of each load lock chamber of the manufacturing apparatus 1, there is a system for transferring wafers 10 via individual conveying robots 9 provided between a plurality of FOUPs 7 and load lock chambers 8, as shown in FIG. 5 by way of example, without adopting a system wherein a plurality of chambers are disposed radially around a conveying robot with the conveying robot being positioned at the center, as in the conventional system. Alternatively, wafers 10 may be transferred via individual conveying robots 9 provided between a plurality of FOUPs 7 and manufacturing apparatuses 1, as shown in FIG. 6, or wafers 10 may be transferred via conveying robots 9 provided between one FOUP 7 and a plurality of manufacturing apparatuses 1, as shown in FIG. 7.

The wafer carried in each manufacturing apparatus 1 is subjected to a predetermined single wafer processing, and, thereafter, it is unloaded from the manufacturing apparatus 1 and accommodated in the FOUP. Then, the wafer is mounted in the corresponding RGV 11 and conveyed to another manufacturing apparatus 1. The wafer, in which a process in a predetermined bay has been completed, is accommodated in the FOUP and conveyed to the bay station BS; and, further, it is fed to a bay station BS of a bay in the next process by an OHS, followed by being subjected to the next single wafer processing.

According to the configuration as described above, the lot configuration of each product (wafer) can be replaced with a minority organization in which 25 sheets/FOUP is changed to 13 sheets/FOUP, by replacing the conventional batch process facility for processing, for example, 25 or more wafers in a batch with a single wafer facility. As a result, the processing time per FOUP can be shortened. By making an extreme minority organization like 1 to 3 sheets/FOUP, the TAT of each product which is short in a delivery period can be significantly shortened.

While the invention developed by the present inventors has been described specifically based on various embodiments, the present invention is not limited to the embodiments as specifically described herein. It is needless to say that various changes can be made thereto within a scope not departing from the substance thereof.

Figure 8:
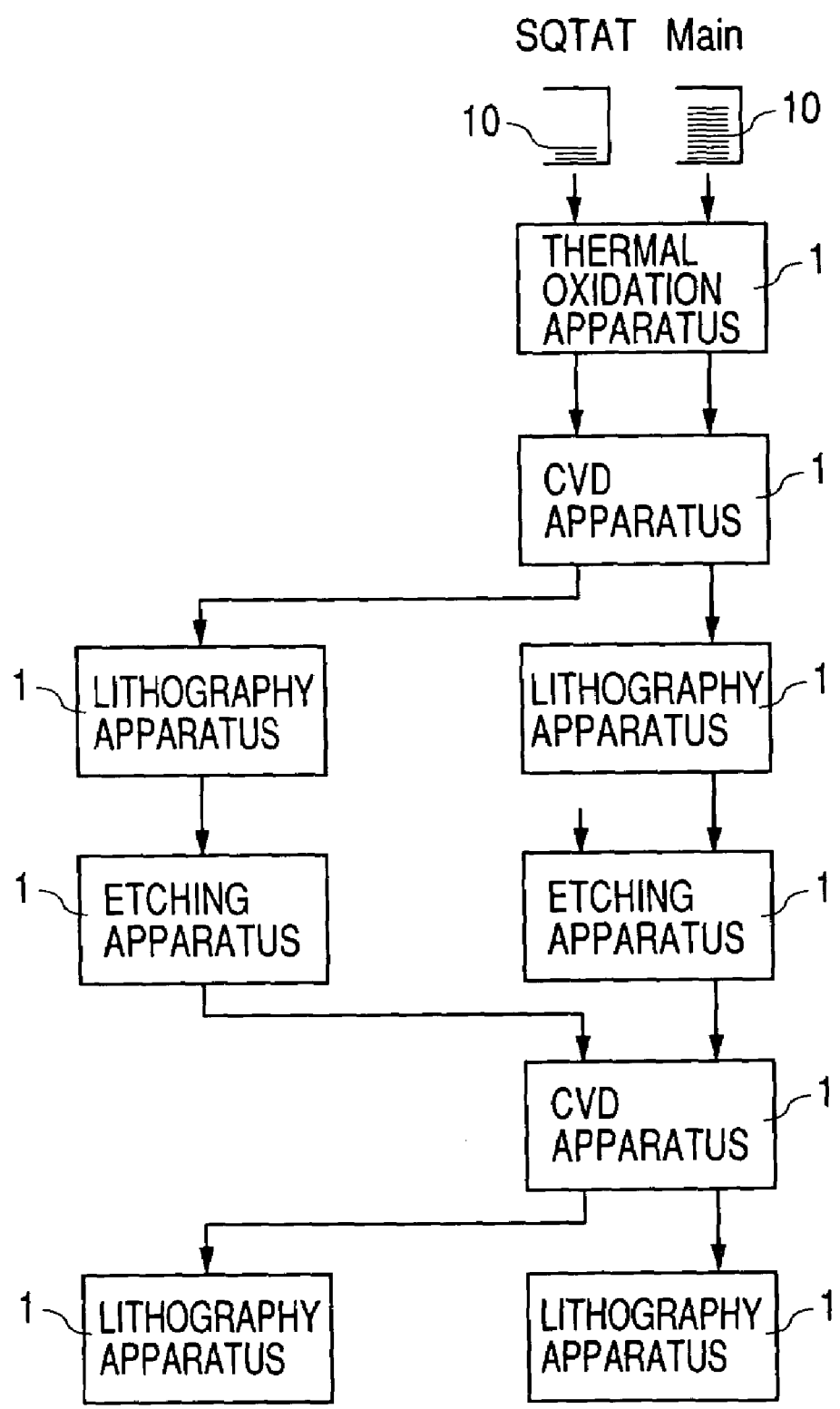
FIG. 8 is a block diagram illustrating another embodiment of a semiconductor production line of the present invention.

As shown in FIG. 8 by way of example, a sub production line, constituted by a group of manufacturing apparatuses that are high in use frequency, is provided in addition to the main production line the sub production line is and used for each product that is short in a delivery period, for example, thereby making it possible to significantly reduce the TAT.

According to the production line of the present invention, the effect of shortening the TAT becomes a maximum where all steps in the wafer process are processed by a single wafer processing system. However, some manufacturing apparatuses which have a short cycle time may be constituted by batch type manufacturing apparatuses.

The conveying rails need not be laid linearly in each area in which high-speed conveyance in the clean room is not required. A mutual entry of plural RGVs, curve running, offshoot running, low-speed running, etc. may be utilized in combination.

The number of bay stations assigned to one RGV is not limited to one. A plurality of bay stations may be allocated. Large-capacity bay stations, each equipped with a wafer stocker function, may partially be placed.

By making it possible to move compartments (partitions) for separating conveying areas and working areas, the size of each human working area relative to its corresponding conveying area can also be changed freely.

Even as to the number of manufacturing apparatuses assigned to one RGV, different numbers may be allocated in respective bays according to the capabilities of the manufacturing apparatuses without making the number thereof identical among all the bays. It is also possible to provide such flexibility that their allocation can be changed with ease during operation.

Effects obtained by representative aspects of the invention disclosed in the present application will be explained in brief as follows:

Since the wafer conveying time can be shortened, the TAT of a semiconductor product that is short in a delivery period, can be shortened.

Since the availability factor of a semiconductor production line can be improved, the TAT of a semiconductor product, that is short in a delivery period, can be shortened.

The invention claimed is:

1. A fabrication method of a semiconductor integrated circuit device, comprising forming integrated circuits over one or plural wafers by a semiconductor production line including:

(a) a plurality of bay areas within a clean room, each bay area having a plurality of semiconductor integrated circuit manufacturing apparatuses;

(b) a plurality of rail guided vehicles provided in each bay area, each rail guided vehicle conveying the one or plural wafers accommodated in a sealed conveying container to one of the semiconductor integrated circuit manufacturing apparatuses by travelling on a lower track laid on a floor;

(c) rail guided vehicle traveling area partition provided in each bay area, surrounding the lower track for the rail guided vehicles to separate from human working areas;

(d) a bay-to-bay conveyance mechanism for conveying the one or plural wafers accommodated in the sealed conveying container between the bays; and (e) a plurality of bay stations respectively provided corresponding to the plural rail guided vehicles within each bay so as to act as intermediary between the rail guided vehicles in each bay and the bay-to-bay conveyance mechanism.

2. A fabrication method according to claim 1, wherein the lower track for the rail guided vehicles is laid on a straight line.

3. A fabrication method according to claim 2, wherein the bay-to-bay conveyance of the one or plural wafers is performed via an upper track mounted to a ceiling in the clean room.

4. A fabrication method according to claim 3, wherein the diameter of each wafer is 300 mm or more.

5. A fabrication method according to claim 2, wherein the human working areas are completely separated from the rail guided vehicle traveling area, by the rail guided vehicle traveling area partition.

6. A fabrication method according to claim 1, wherein the plurality of semiconductor integrated circuit manufacturing apparatuses have, at one side thereof in a respective bay area, the plurality of rail guided vehicles; and, at the other side thereof, another area, where new manufacturing apparatuses are carried in the clean room and retired manufacturing apparatuses are carried out of the clean room, the manufacturing apparatuses being between the rail guided vehicles and said another area.

7. A fabrication method according to claim 6, wherein human operations on the manufacturing apparatuses are carried out in said another area.

8. A fabrication method according to claim 1, wherein, in a respective bay area, the plurality of rail guided vehicles are provided at one side of the plurality of semiconductor integrated circuit manufacturing apparatuses and an area for human operations is provided at another side thereof, such that the plurality of semiconductor integrated circuit manufacturing apparatuses is provided between the plurality of rail guided vehicles and said area for human operations.

* * * * *